(12) United States Patent
Moon et al.

(10) Patent No.: US 8,164,126 B2
(45) Date of Patent: Apr. 24, 2012

(54) CMOS IMAGE SENSORS INCLUDING BACKSIDE ILLUMINATION STRUCTURE

(75) Inventors: Chang-Rok Moon, Seoul (KR); Duck-hyung Lee, Gyeonggi-do (KR); Seong-ho Cho, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 558 days.

(21) Appl. No.: 12/037,691

(22) Filed: Feb. 26, 2008

(65) Prior Publication Data

US 2008/0203452 A1     Aug. 28, 2008

(30) Foreign Application Priority Data

Feb. 26, 2007   (KR) .................. 10-2007-0019134

(51) Int. Cl.
*H01L 31/062* (2012.01)
(52) U.S. Cl. ..................... 257/292; 257/294; 438/48
(58) Field of Classification Search .............. 438/59, 438/643; 257/292, E27.133, E31.084, 294, 257/347, E31.115
See application file for complete search history.

(56) References Cited

U.S. PATENT DOCUMENTS

| | | | | |
|---|---|---|---|---|
| 5,472,914 A | * | 12/1995 | Martin et al. | 438/59 |
| 6,168,965 B1 | | 1/2001 | Malinovich et al. | |
| 2002/0020863 A1 | * | 2/2002 | Lee et al. | 257/292 |
| 2006/0068586 A1 | * | 3/2006 | Pain | 438/643 |
| 2006/0180860 A1 | * | 8/2006 | Pan et al. | 257/347 |

FOREIGN PATENT DOCUMENTS

| | | |
|---|---|---|
| JP | 2005-0259828 | 9/2005 |
| KR | 2006-0077132 A | 7/2006 |
| KR | 2006-0077173 A | 7/2006 |

* cited by examiner

*Primary Examiner* — Matthew E Warren
*Assistant Examiner* — Fang-Xing Jiang
(74) *Attorney, Agent, or Firm* — Myers Bigel Sibley & Sajovec, P.A.

(57) ABSTRACT

An image sensor having a backside illumination structure can include a photo diode unit in a first wafer, where the photo diode unit includes photo diodes and transfer gate transistors coupled to respective ones of the photo diodes. A wiring line unit can be included on a second wafer that is bonded to the photo diode unit, where the wiring line unit includes wiring lines and transistors configured to process signals provided by the photo diode unit and configured to control the photo diode unit. A supporting substrate is bonded to the wiring line unit and a filter unit is located under the first wafer.

16 Claims, 7 Drawing Sheets

CMOS IMAGE SENSORS INCLUDING BACKSIDE ILLUMINATION STRUCTURE

CROSS-REFERENCE TO RELATED PATENT APPLICATION

This application claims the benefit of Korean Patent Application No. 10-2007-0019134, filed on Feb. 26, 2007 in the Korean Intellectual Property Office, the disclosure of which is incorporated herein in its entirety by reference.

FIELD OF THE INVENTION

The present invention relates to image sensors and methods of manufacturing image sensors.

BACKGROUND

Image sensors are semiconductor devices that convert an optical image into an electric signal. Examples of image sensors are a charge coupled device (CCD) and a complementary metal-oxide-silicon (CMOS) image sensor.

The CCD includes metal-oxide-silicon capacitors that are formed very close to one another, wherein charge carriers are stored and transported into the metal-oxide-silicon capacitors. The CMOS image sensor functions based on CMOS technology, which uses control circuits and signal processing circuits as peripheral circuits, employs a switching method in which MOS transistors are formed corresponding to the number of pixels and the output is detected using the MOS transistors.

The CMOS image sensor may be driven more easily than the CCD, and may be advantageous in terms of minimized modules because signal processing circuits can be integrated into one chip, and thus, a system-on-chip may be realized. Accordingly, CMOS image sensors are widely used in mobile phones, cameras for personal computers, and electronic appliances.

FIG. 1 is a cross-sectional view of a conventional 3D integration CMOS image sensor.

Referring to FIG. 1, the conventional 3D integration CMOS image sensor includes a light receiving unit including a photo diode (PD) 10 formed on a substrate, a wiring line layer 20, a color filter array (CFA) 30, and a micro-lens 40. As such, the wiring line layer 20 comprises a plurality of wiring lines M1 through M4 and transparent insulating layers disposed between the CFA 30 and the PD 10.

The manufacturing method of the conventional 3D integration CMOS image sensor includes a back end of line (BEOL) method, that is, a metal line method that is similar to that in a manufacturing process of a semiconductor device. In this case, different insulating materials can be used for forming a pre-metal dielectric (PMD), an inter-metal dielectric (IMD), and a passivation layer. Thus, light may be diffused at interfaces between the pre-metal dielectric (PMD), inter-metal dielectric (IMD), and passivation layers, and as such, the photosensitivity of the conventional 3D integration CMOS image sensor may be decreased.

Also, due to the different refractive indices of the different insulating layers, the photosensitivity of the conventional 3D integration CMOS image sensor may be decreased due to the refraction of light. In addition, since the metal wiring lines M1 through M4 are formed and the transparent insulating layers are planarized after forming a photo diode when manufacturing the conventional 3D integration CMOS image sensor, defects due to these processes may occur.

In cases where a plurality of transistors are arranged around the photo diode for signal processing and control, the surface area for receiving light for each pixel may be reduced. In other words, saturation of a light-receiving region of each pixel may be reduced. Accordingly, noise may be increased, and a danger of losing images according to such noise increases, and thereby, deteriorating image quality.

SUMMARY

According to an aspect of the present invention, there is provided an image sensor having a backside illumination structure, comprising: a photo diode unit comprising photo diodes formed, and transfer gate transistors, which respectively correspond to the photo diodes, formed in a first wafer; a wiring line unit comprising transistors, for signal processing and controlling, and wiring lines formed on a second wafer bonded to the photo diode unit; a supporting substrate bonded to the wiring line unit; and a filter unit formed under the first wafer.

The second wafer may be implanted with hydrogen ions, and the wiring line unit may include the transistors, for signal processing and controlling, formed on a region that is remained after a predetermined portion of the second wafer is removed by smart-cutting. The second wafer may be bonded to the photo diode unit by being closely stacked and annealing.

The photo diode unit may include floating diffusion regions respectively formed adjacent to the photo diodes and an insulating layer formed on the entire first wafer covering the transfer gate transistors. The transistors, for signal processing and controlling, may include at least one of a source follower transistor, a selection transistor, and a reset transistor.

In order to maximize saturation, one transistor (1 Tr/pixel) may be formed for one photo diode in the photo diode unit in the image sensor. Also, the filter unit may include filter arrays transmitting light according to its wavelength and micro-lenses for focusing light to the filter arrays, and light may be directly incident on the photo diodes through the filter unit. The wiring line unit may be formed above the photo diodes and not under the photo diodes, and thus, photosensitivity of light may be maximized.

According to another aspect of the present invention, there is provided a method of manufacturing an image sensor having a backside illumination structure, the method comprising: forming a photo diode unit comprising photo diodes, and transfer gate transistors, which respectively correspond to the photo diodes, in a first wafer; bonding the photo diode unit on a second wafer and forming a wiring line unit including transistors, for signal processing and controlling, and wiring lines on the second wafer; bonding a supporting substrate on the wiring line unit; and forming a filter unit below the first wafer.

The forming of the photo diode unit may comprise: forming photo diodes in the first wafer; forming floating diffusion regions respectively in the first wafer adjacent to the photo diodes; forming the transfer gate transistors respectively on the photo diodes; and forming an insulating layer on the entire surface of the first wafer covering the transfer gate transistors.

Also, the second wafer may be implanted with hydrogen ions, and the bonding of the second wafer to the photo diode unit and the forming of the wiring line unit may comprise: bonding a top surface of the second wafer that is implanted with hydrogen ions to the photo diode unit; removing a predetermined portion of the second wafer by smart-cutting; forming transistors, for signal processing and controlling, on the remaining second wafer; and performing a back end of line (BEOL) process on the transistors that are used for signal processing and controlling. Each of the transistors, for signal processing and controlling, may include at least one of a source follower transistor, a selection transistor, and a reset transistor.

The method may further comprise polishing a rear surface of the first wafer in order for the first wafer to be thin before forming a filter unit below the first wafer. The first wafer may have a thickness of 10 µm or less due to the polishing. The forming of the filter unit may comprise: forming filter arrays below the first wafer, which transmit light according to the wavelength of light; and forming micro-lenses for focusing light under the filter array.

According to the present invention, as the wiring lines are formed in front of the photo diode and the filter unit is disposed at the backside, the problem of decrease in photosensitivity which occurs in the conventional art due to the presence of conventional metal wiring lines can be effectively excluded. In addition, only one transistor is formed for one photo diode in the photo diode unit, and thus, the saturation of the light receiving region can be maximized. Furthermore, transistors and wiring lines are formed after bonding the second wafer, and thus vertical contacts and vias can be easily formed between the transistors and the wiring lines.

DESCRIPTION OF EMBODIMENTS ACCORDING TO THE INVENTION

Figure 1:
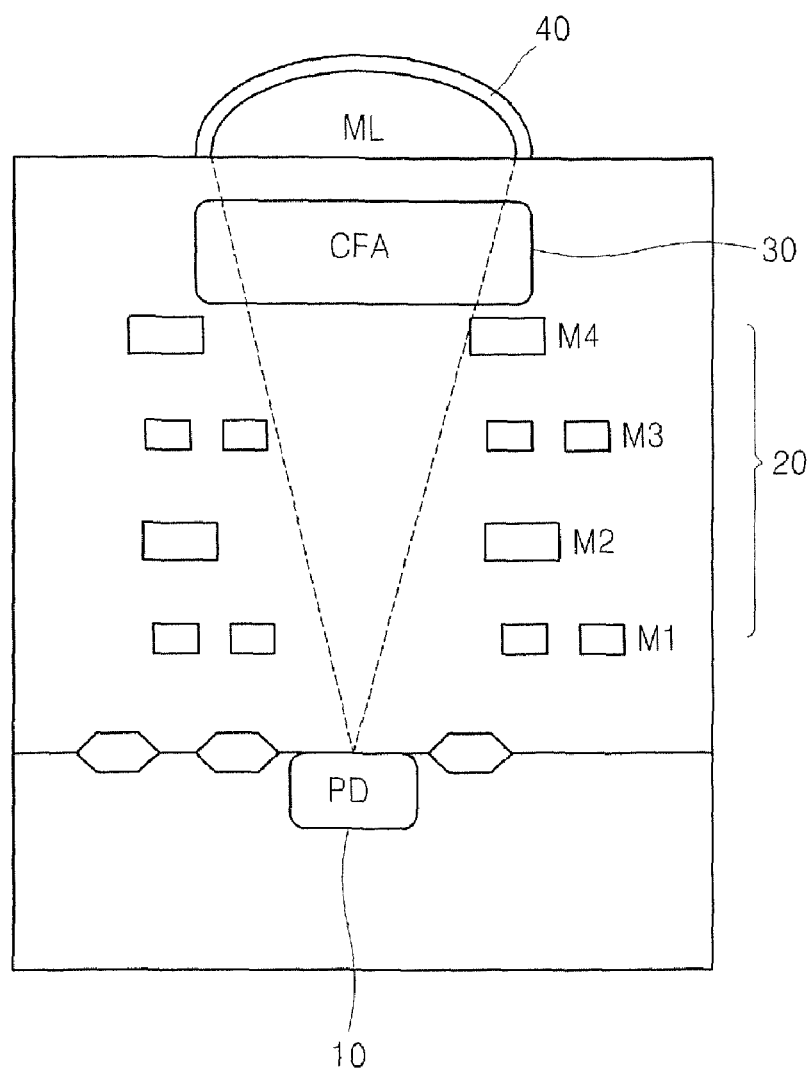
FIG. 1 is a cross-sectional view of a conventional three dimensional (3D) integration complementary metal-oxide-silicon (CMOS) image sensor.

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Moreover, each embodiment described and illustrated herein includes its complementary conductivity type embodiment as well.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

It will be understood that, as used herein, the term "downstream" can be used to indicate the relative position of an element or unit within an incident light path. For example, when a first element or unit is described as positioned downstream in the incident light path relative to a second element, the incident light transmitted along the incident light path impacts the second element before the first element. Conversely, as used herein, the term "upstream" can also be used to indicate the relative position of the element or unit within an incident light path. In the example given above, the second element can be described as being upstream from the first element.

As described herein, as appreciated by the present inventors, improved image quality and reduced noise may be provided by configuring a CMOS image sensor photodiode to be down stream from a color filter array and micro-lens in an incident light path while also being upstream in the path from the wiring layers, etc. This arrangement may also reduce diffraction and diffusion of light along the light path to the photodiodes.

Figure 2:
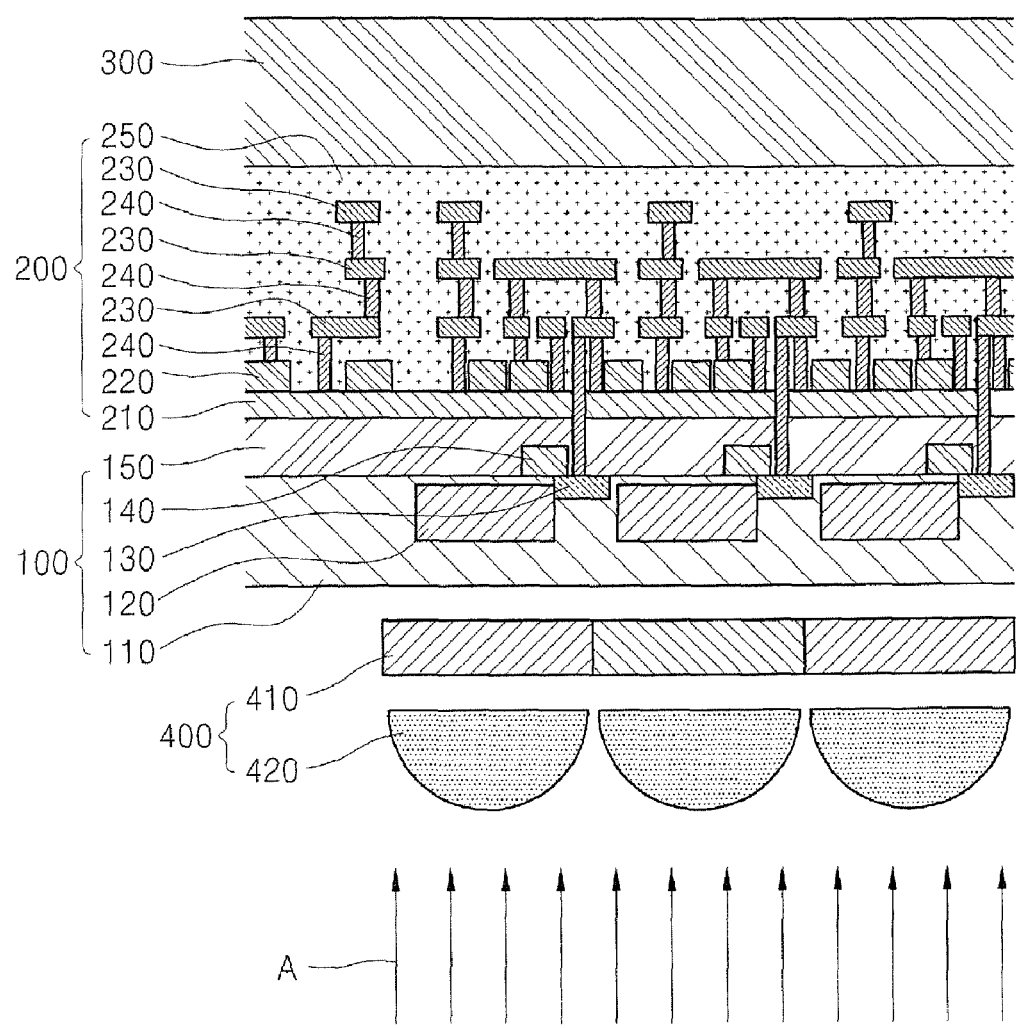
FIG. 2 is a cross-sectional of an image sensor having a backside illumination structure according to an embodiment of the present invention.

FIG. 2 is a cross-sectional of an image sensor having a backside illumination structure according to an embodiment of the present invention. Referring to FIG. 2, the image sensor includes a photo diode unit 100 comprising a first wafer 110, a wiring line unit 200 comprising a second wafer 210 that is on the photo diode unit 100, a supporting substrate 300 formed on the wiring line unit 200, and a filter unit 400 formed below the first wafer 110.

The photo diode unit 100 includes photo diodes 120 formed in a first wafer 110, floating diffusion (FD) regions 130 respectively formed adjacent to the photo diodes 120, and transfer gate transistors 140 respectively formed on the photo diodes 120 for transmitting signals thereto. A first insulating layer 150 is formed on the entire first wafer 110 covering the transfer gate transistors 140.

The photo diode unit 100 of the image sensor according to the current embodiment of the present invention includes a transfer gate transistor 140 for each photo diode 120, and thus, saturation of the image sensor can be significantly increased as compared to a conventional image sensor. The saturation of the image sensor refers to the percentage of the surface area of a light receiving region to a unit pixel surface area and is referred to as a fill factor. The conventional image sensor has low saturation because a plurality of transistors, for signal processing and controlling, are formed around the light-receiving region in which the photo diode is formed. However, in the image sensor according to the current embodiment of the present invention, only one transfer gate transistor 140 is formed for each photo diode 120, and thus, saturation of the image sensor can be maximized.

The wiring line unit 200 is formed on the photo diode unit 100 and includes transistors 220, for signal processing and controlling, formed on the second wafer 210, a plurality of wiring lines 230, and vertical contacts or vias 240 electrically connecting the transistors 220 and 240 to the wiring lines 230 and the wiring lines 230 to each other. A second insulating layer 250 is formed on the second wafer 210 as described above, and the second insulating layer 250 may be formed of a plurality of insulating layers formed of various insulating materials as described above.

The transistors 220, for signal processing and controlling, may be at least one of a source follower transistor, a selection transistor, and a reset transistor, however, not a transfer gate transistor. The transfer gate transistors 140 and the transistors 220, for signal processing and controlling, are connected via the vertical contacts or vias 240 that are connected to the wiring lines 230.

The vertical contacts or vias 240 are formed together with the wiring lines 230 after the second wafer 210 is bonded to the photo diode unit 100, and thus, can be easily aligned. Accordingly, the vertical contacts or vias 240 can be formed to have a very small width.

A supporting substrate 300 is bonded on the wiring line unit 200, and the supporting substrate 300 supports the entire image sensor.

The filter unit 400 formed below the first wafer 110 includes color filter arrays 410 of red, green, and blue colors, which transmit light according to the wavelength of light and micro-lenses 420 for focusing light under the color filter arrays 410.

The image sensor according to the current embodiment of the present invention includes the filter unit 400 formed below the first wafer 110 in which the photo diodes 120 are formed, and thus, has a backside illumination structure in which light A is incident under the first wafer 110. Accordingly, problems such as a decrease in the photosensitivity due to diffused reflection or difference in the refractive index of the conventional front side illumination structure caused by light passing through a wiring line layer can be effectively solved. Also, the first wafer 110 is made to several μm or less by polishing a rear surface of the first wafer 110, and thereby, reducing the incident distance of light and increase the photosensitivity of the image sensor.

FIGS. 3A through 3I are cross-sectional views illustrating a method of manufacturing an image sensor having a backside illumination structure, according to another embodiment of the present invention.

Figure 3A:
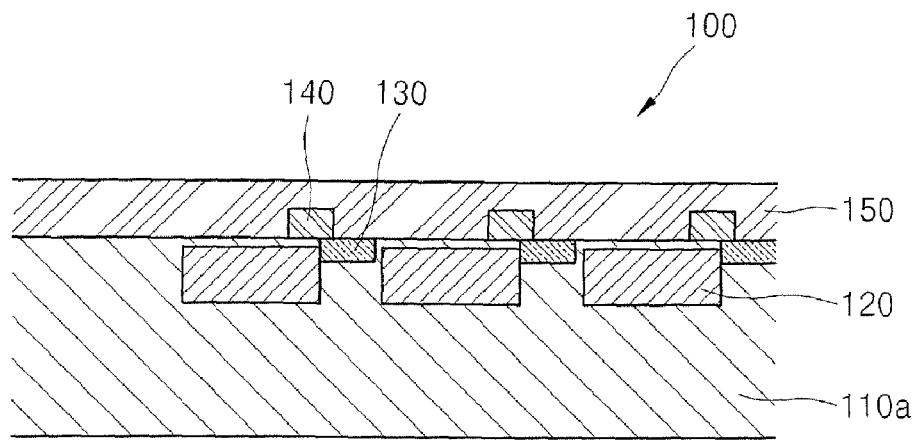
FIGS. 3A through 3I are cross-sectional views illustrating a method of manufacturing an image sensor having a backside illumination structure, according to another embodiment of the present invention.

Referring to FIG. 3A, first, the photo diodes 120 and the floating diffusion regions 130 are formed in a first wafer 110a, the transfer gate transistors 140 are formed on the first wafer 110a, and a first insulating layer 150 is formed on the entire surface of the first wafer 100a covering the transfer gate transistors 140 to complete a photo diode unit 100.

Figure 3B:
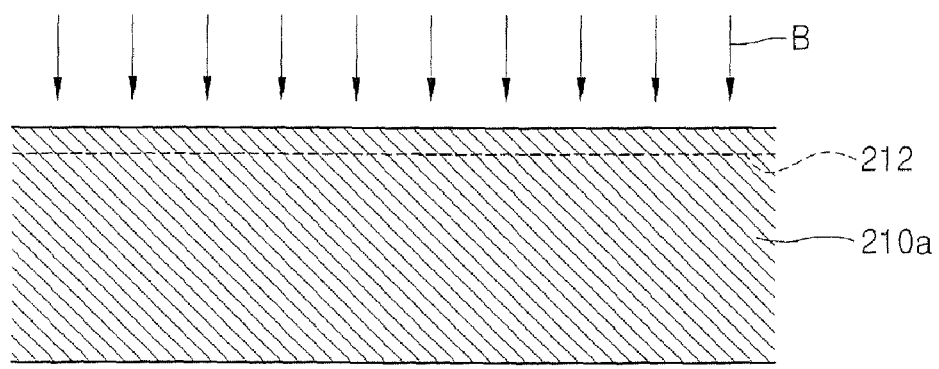

Referring to FIG. 3B, a second wafer 210a, which is different from the first wafer 110a, is prepared and hydrogen ions are implanted into the second wafer 210a as indicated by arrow B. Hydrogen ions are implanted in the second wafer to cut a predetermined portion of the second wafer 210a by smart-cutting, which will be performed later, to remove the predetermined portion of the second wafer 210a. In the present embodiment, hydrogen ions are implanted into the second wafer 210a up to a point shown by dotted line 212, as shown in FIG. 3B, and, as later performed, the predetermined portion from the dotted line 212 to an upper surface of the second wafer 210a is cut. Here, the upper surface of the second wafer 210a is illustrated to be in the lower portion of FIG. 3B as the second wafer 210a is arranged such that a surface thereof above the dotted line 212 that is to be bonded to the first insulating layer 150 later is oriented upward.

Figure 3C:
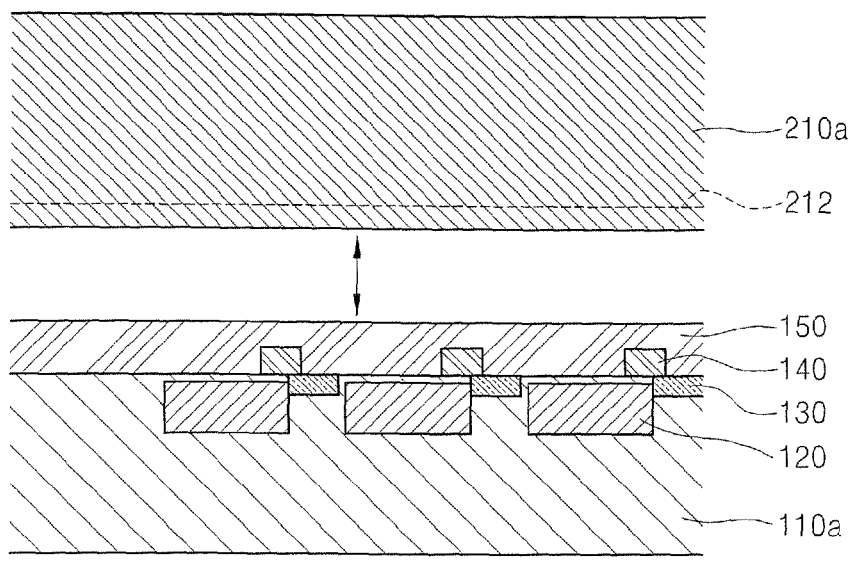

Referring to FIG. 3C, the second wafer 210a is bonded to the photo diode unit 100 by annealing after the predetermined portion of the second wafer 210a has been removed. In detail, the second wafer 210a is closely stacked on the photo diode unit 100 and annealed at a suitable temperature. Thus, the predetermined portion of the second wafer 210a, that is, an upper portion from the dotted line 212 to the upper surface of the second wafer 210a is separated, and thus removed from the second wafer 210a. Such a method is called smart-cutting and the annealing may be performed at 300 to 600° C.

Figure 3D:
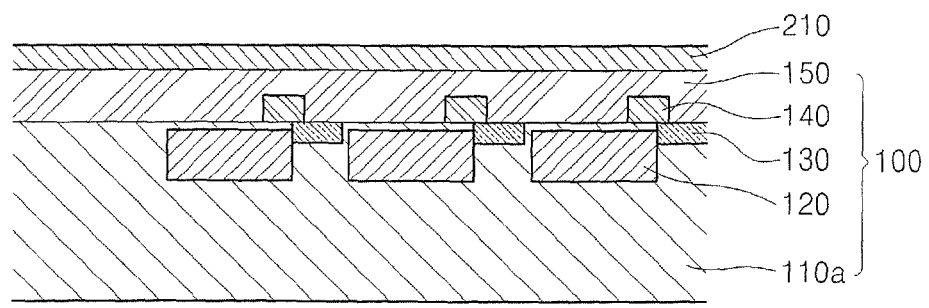

Referring to FIG. 3D, the second wafer 210 that has the predetermined portion removed is stacked on the photo diode unit 100. Then, annealing at a higher temperature may further be performed in order to strengthen the bonding of the second wafer 210a to the photo diode unit 100.

Figure 3E:
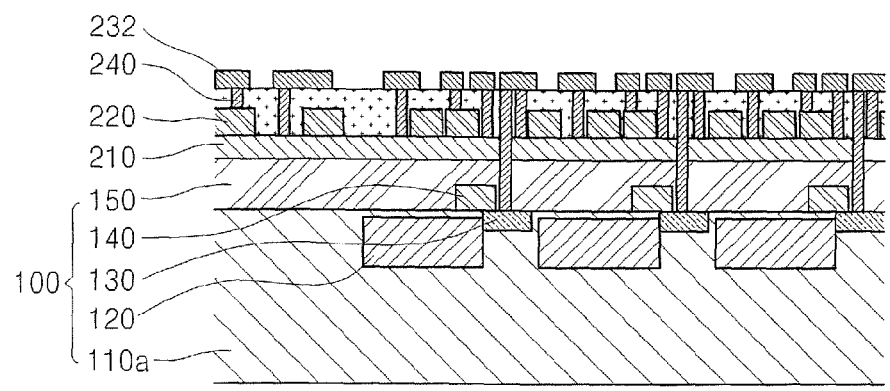

Referring to FIG. 3E, the transistors 220, for signal processing and controlling, are formed on the second wafer 210. For example, the transistors 220, for signal processing and controlling, may each be a source follower transistor, a selection transistor, or a reset transistor except for a transfer gate transistor. The first wiring lines 232 may be formed above the transistors 220 for signal processing and controlling. The vertical contacts or vias 240 are formed before the first wiring lines 232 are formed, and thus, the transistors 220, for signal processing and controlling, and the transfer gate transistors 140 can be electrically connected to the first wiring lines 232.

Figure 3F:
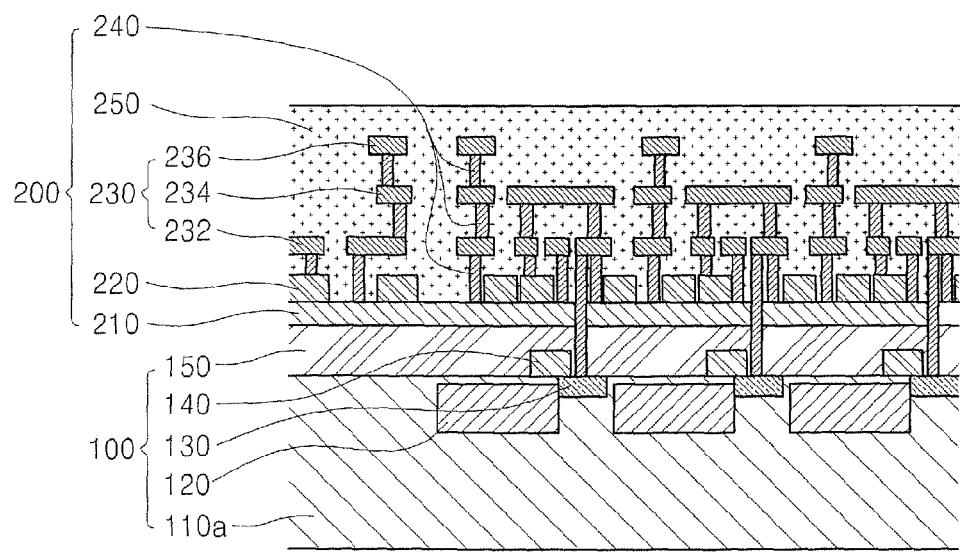

Referring to FIG. 3F, a plurality of wiring lines such as second and third wiring lines 234 and 236 may further be formed above the first wiring lines 232, and the second and third wiring lines 234 and 236 are also electrically connected to each other via the vertical contacts or vias 240. In the present embodiment, the wiring lines 230 comprising the first, second and third wiring lines 232, 234 and 236 are formed, however, there can be more or less than three wiring lines formed.

The wiring line unit 200 is completed by fully completing the process of the wiring lines 230 that is referred to as a back end of line (BEOL) process. In the present embodiment, the second insulating layer 250 is illustrated to be one layer as in FIG. 3F, however, as described above, the wiring lines 230 can be formed as a plurality of wiring lines and thus interlayer insulating layers between wiring lines may also be formed as multiple layers formed of other insulating materials.

Figure 3G:
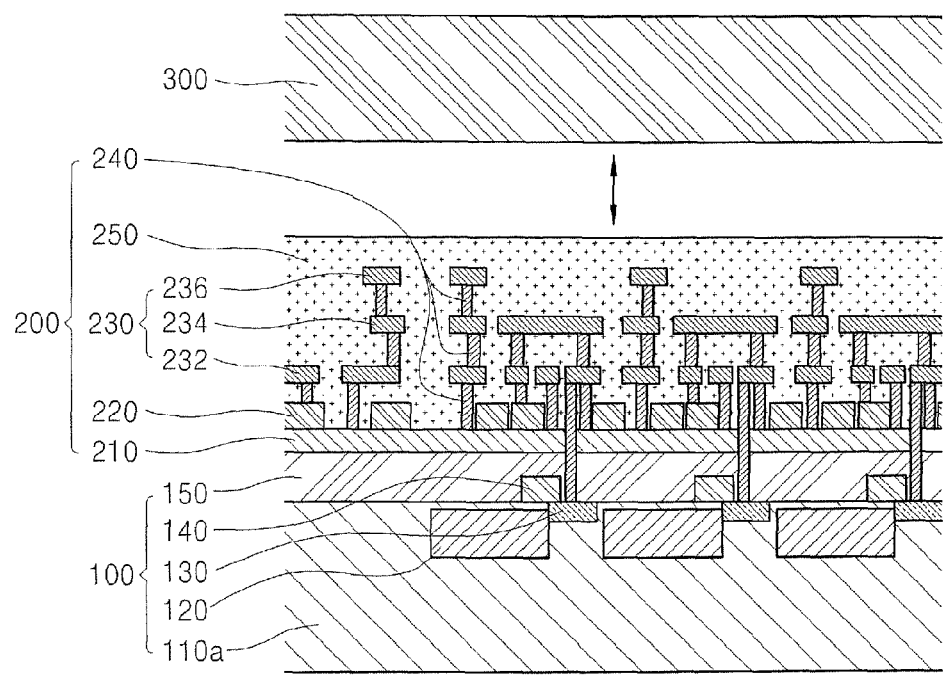

Referring to FIG. 3G, the supporting substrate 300, such as a third wafer, is bonded on the wiring line unit 200 after the BEOL process. The supporting substrate 300 supports the entire image sensor. Like the second wafer 210, the supporting substrate 300 is also bonded by being closely stacked on the wiring line unit 200 and annealed at a high temperature.

Figure 3H:
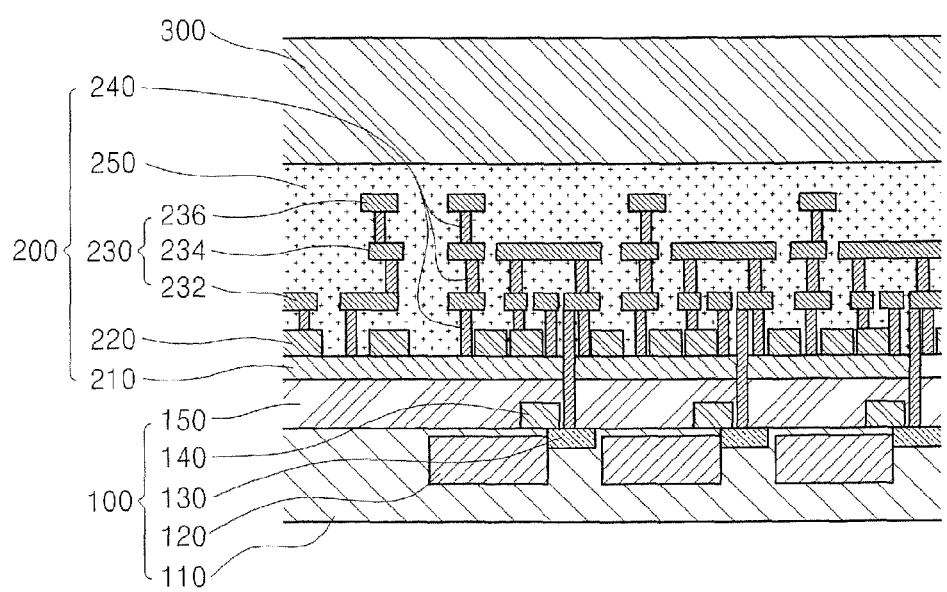

Referring to FIG. 3H, a rear surface of the first wafer 110a, in which the photo diode unit 100 is formed, is polished. The thickness of the first wafer 110a can be controlled to be several μm, for example, 10 μm or less, by polishing. Accordingly, the path of light incident from the filter unit 400 that is to be formed below the first wafer 110a is minimized to maximize the photosensitivity of the photo diodes 120.

Figure 3I:
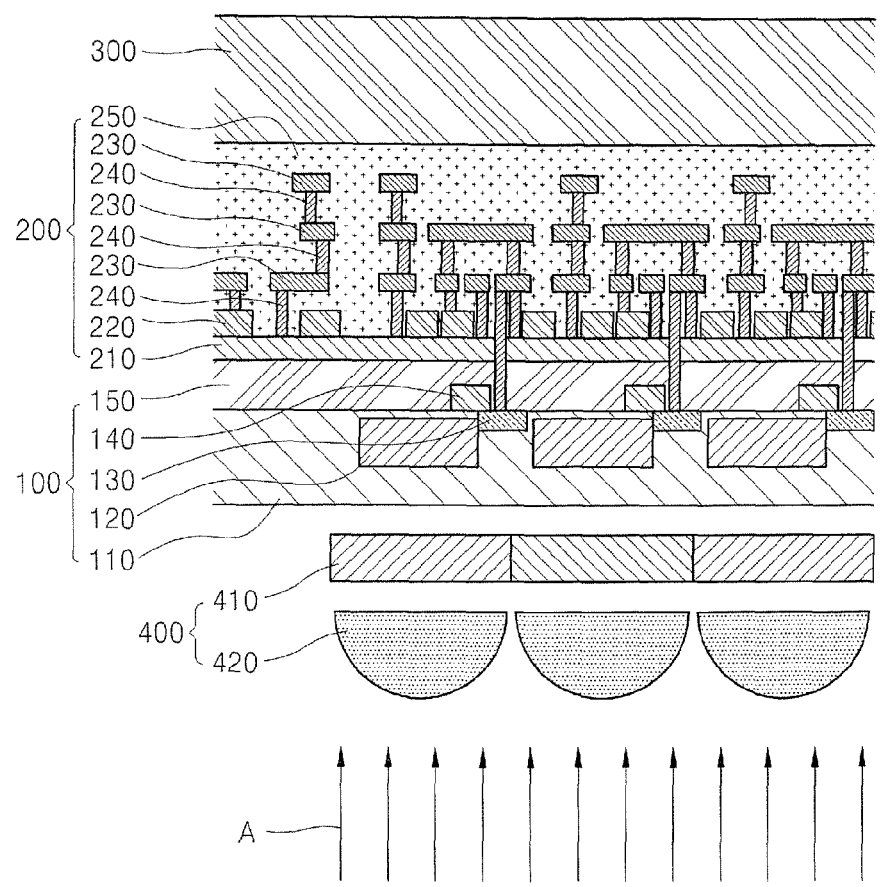

Referring to FIG. 3I, the filter unit 400 is formed below the rear surface of the first wafer 110a. In other words, the color filter arrays 410 and the micro-lenses 420 are formed.

According to the method of manufacturing an image sensor according to the present invention, the wiring line unit 200 is formed in an opposite direction to the filter unit 400 through which light is incident, and thus the conventional problem such as a decrease in photosensitivity due to the diffused reflection or difference in the reflective index caused by light passing through wiring lines 230 between insulating layers can be effectively excluded. In addition, since the wiring line unit 200 is formed after the second wafer 210 is bonded to the photo diode unit 100, the vertical contacts or holes 240 between the transfer gate transistors 140, transistors for signal processing and controlling, and the wiring lines 230 can be easily formed to a small width.

Also, according to the method of manufacturing an image sensor according to the present invention, the photo diode unit is formed such that one transistor, that is, one transfer gate transistor, is formed for one photo diode. Thus, saturation of the light receiving region can be maximized.

As described above, the image sensor having a backside illumination structure and the method of manufacturing the image sensor according to the present invention includes metal wiring lines arranged in front of the photo diodes and the filter unit at the backside of the photo diodes, and thus the problem of a decrease in photosensitivity caused by the metal wiring lines in the conventional art can be effectively excluded.

Also, since one transistor is formed for one photo diode in the photo diode unit, saturation of the light receiving region can be maximized.

Furthermore, since the transistor and the wiring lines are formed after bonding the second wafer, transistors, and vertical contacts or vias between the wiring lines can be easily formed.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed:

1. An image sensor having a backside illumination structure, comprising:
    a photo diode unit in a first wafer, the photo diode unit comprising photo diodes and transfer gate transistors coupled to respective ones of the photo diodes, and the photo diode unit configured to be positioned in an incident light path;
    a wiring line unit on a second wafer, a side of the second wafer that faces upstream in the incident light path bonded to a downstream-facing side of the photo diode unit, the wiring line unit comprising wiring lines and transistors configured to process signals provided by the photo diode unit and configured to control the photo diode unit, and the second wafer positioned between the transistors in the wiring line unit and the photo diodes;
    a supporting substrate bonded to a downstream-facing side of the wiring line unit; and
    a filter unit upstream in the incident light path from the first wafer such that the photo diode unit is between the filter unit and the wiring line unit.

2. The image sensor of claim 1, wherein the second wafer is implanted with hydrogen ions, and the wiring line unit includes the transistors on a region that remains after a predetermined portion of the second wafer is removed by smart-cutting.

3. The image sensor of claim 2, wherein the second wafer is bonded to the photo diode unit by being closely stacked thereon and annealed.

4. The image sensor of claim 1, wherein the photo diode unit includes respective floating diffusion regions adjacent to the photo diodes, and an insulating layer on the entire first wafer covering the transfer gate transistors.

5. The image sensor of claim 1, wherein the transistors comprise a source follower transistor, a selection transistor, and/or a reset transistor.

6. The image sensor of claim 1, wherein one transistor (1Tr/pixel) is included for one photo diode in the photo diode unit.

7. The image sensor of claim 1, wherein the first wafer has a thickness of about 10 μm or less.

8. The image sensor of claim 1, wherein the filter unit includes filter arrays configured to transmit light having wavelengths corresponding respective predetermined ones of the filter arrays and micro-lenses for focusing light onto the filter arrays, wherein light transmitted through the filter unit is directly incident on the photo diodes.

9. The image sensor of claim 8, wherein the wiring line unit is positioned downstream in the incident light path from the photo diodes and the filter unit.

10. The image sensor of claim 1, wherein the transfer gate transistors provide the signals processed by the transistors in the wiring line unit.

11. A CMOS image sensor circuit comprising:
a photo diode unit comprising photo diodes and transfer gate transistors coupled to respective ones of the photo diodes, the photo diode unit configured to be positioned in an incident light path;
a micro-lens and filter unit upstream in the incident light path from the photo diode unit;
a wiring line unit positioned downstream in the incident light path from the photo diode unit, the wiring line unit comprising wiring lines and transistors configured to process signals provided by the photo diode unit; and
a wafer between the transistors in the wiring line unit and the photo diodes.

12. A CMOS image sensor circuit according to the claim 11 wherein the wiring line unit is positioned on a first side of the photo diode unit and the micro-lens and filter unit is positioned on a second side of the photo diode unit that is opposite the first side.

13. A CMOS image sensor circuit according to the claim 11 wherein a single pass transistor is included for a corresponding single one of the photo diodes in the photo diode unit.

14. A CMOS image sensor circuit according to claim 11, wherein the transfer gate transistors provide the signals processed by the transistors in the wiring line unit.

15. A CMOS image sensor circuit according to claim 14, further comprising contacts connecting the transfer gate transistors and the transistors in the wiring line unit, wherein the transfer gate transistors are between the wafer and the photo diodes.

16. The image sensor of claim 10,
wherein the transfer gate transistors are between the second wafer and the photo diodes, and
wherein the transistors in the wiring line unit are between the supporting substrate and the second wafer.

* * * * *